US011271554B2

(12) United States Patent
Satoh et al.

(10) Patent No.: US 11,271,554 B2
(45) Date of Patent: Mar. 8, 2022

(54) CONTROL CIRCUIT AND SENSOR DEVICE (71) Applicant: Hitachi Astemo, Ltd., Hitachinaka (JP)

(72) Inventors: Akeo Satoh, Hitachinaka (JP); Akira Kotabe, Hitachinaka (JP); Tatsuo Nakagawa, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/286,243

(22) PCT Filed: Sep. 13, 2019

(86) PCT No.: PCT/JP2019/036025
§ 371 (c)(1),
(2) Date: Apr. 16, 2021

(87) PCT Pub. No.: WO2020/080004
PCT Pub. Date: Apr. 23, 2020

(65) Prior Publication Data
US 2021/0344333 A1    Nov. 4, 2021

(30) Foreign Application Priority Data
Oct. 18, 2018 (JP) .............................. JP2018-196295

(51) Int. Cl.
*H03B 1/00*       (2006.01)
*H03K 3/00*       (2006.01)
(Continued)

(52) U.S. Cl.
CPC ....... *H03K 5/1252* (2013.01); *H03K 17/6872* (2013.01)

(58) Field of Classification Search
CPC .................... H03K 5/1252; H03K 17/6872
(Continued)

(56) References Cited

U.S. PATENT DOCUMENTS

2018/0013298 A1    1/2018  Abe et al.
2018/0182749 A1*   6/2018  Dai ..................... H01L 27/0285

FOREIGN PATENT DOCUMENTS

JP          10-224201 A       8/1998
JP        2013124879 A   *   6/2013
(Continued)

OTHER PUBLICATIONS

International Search Report (PCT/ISA/210) issued in PCT Application No. PCT/JP2019/036025 dated Jan. 7, 2020 with English translation (three (3) pages).
(Continued)

*Primary Examiner* — Metasebia T Retebo
(74) *Attorney, Agent, or Firm* — Crowell & Moring LLP (57) ABSTRACT

To prevent an output of an intermediate potential by suppressing sneaking of a current from a signal line to a power line at the time of disconnection of a power supply. A control circuit which receives a power supply voltage from a power line L11 and outputs an output signal to a signal line L12 includes: a load R11 which is provided between the power line and the signal line; a first transistor P11 which is provided between the load and the signal line; a second transistor P12 which is provided between a well of the first transistor and the power line; and a gate control circuit 15 which connects a gate terminal of the first transistor and a gate terminal of the second transistor to the signal line and turns off the first transistor and the second transistor, at the time of disconnection of a power supply.

11 Claims, 10 Drawing Sheets

(51) Int. Cl.
*H03K 5/1252* (2006.01)
*H03K 17/687* (2006.01)

(58) Field of Classification Search
USPC .......................................................... 327/109
See application file for complete search history.

(56) References Cited

FOREIGN PATENT DOCUMENTS

| | | |
|---|---|---|
| JP | 2016-192838 A | 11/2016 |
| JP | 2018-11387 A | 1/2018 |

OTHER PUBLICATIONS

Japanese-language Written Opinion (PCT/ISA/237) issued in PCT Application No. PCT/JP2019/036025 dated Jan. 7, 2020 (three (3) pages).

* cited by examiner

CONTROL CIRCUIT AND SENSOR DEVICE

TECHNICAL FIELD

The present invention relates to a control circuit and a sensor device.

BACKGROUND ART

Conventionally, as a control circuit that operates by receiving a power supply voltage, a control circuit that protects a circuit from reverse connection of a power supply has been known (see, for example, PTL 1). In the control circuit described in PTL 1, a first transistor (P-channel metal oxide semiconductor (PMOS) transistor) is provided between a power line and a signal line, and a second transistor (PMOS transistor) for well control is provided between the power line and a well (body) of the first transistor. Gate terminals of the first and second transistors are connected to a ground. When the power supply is reversely connected, the first and second transistors are turned off to prevent a current from the ground to the power line.

CITATION LIST

Patent Literature

PTL 1: JP 2016-192838 A

SUMMARY OF INVENTION

Technical Problem

However, in the control circuit described in PTL 1, at the time of disconnection of the power supply, gates of the first and second transistors become a ground potential, such that the first and second transistors are turned on. In addition, since the power line becomes a ground potential, there was a problem that when a signal potential is high, the first and second transistors are turned on, such that a current sneaks from the signal line to the power line to output an intermediate potential.

The present invention is to solve the problem described above, and an object of the present invention is to provide a control circuit and a sensor device capable of preventing an output of an intermediate potential by suppressing sneaking of a current from a signal line to a power line at the time of disconnection of a power supply.

Solution to Problem

A control circuit according to an aspect of the present invention is a control circuit which receives a power supply voltage from a power line and outputs an output signal to a signal line, and includes: a load which is provided between the power line and the signal line; a first transistor which is provided between the load and the signal line or between the power line and the load; a second transistor which is provided between a well of the first transistor and the power line; and a gate control circuit which connects a gate terminal of the first transistor and a gate terminal of the second transistor to the signal line and turns off the first transistor and the second transistor, at the time of disconnection of a power supply.

Advantageous Effects of Invention

According to the present invention, it is possible to suppress sneaking of a current from the signal line to the power line to prevent an output of an intermediate potential, by cutting off the first and second transistors at the time of the disconnection of the power supply. Further features related to the present invention will become apparent from a description of the present specification and the accompanying drawings. In addition, objects, configurations, and effects other than those described above will become apparent from a description of embodiments provided below.

DESCRIPTION OF EMBODIMENTS

First Embodiment

Hereinafter, a sensor device according to a first embodiment will be described with reference to FIGS. 1 to 3.

Figure 1:
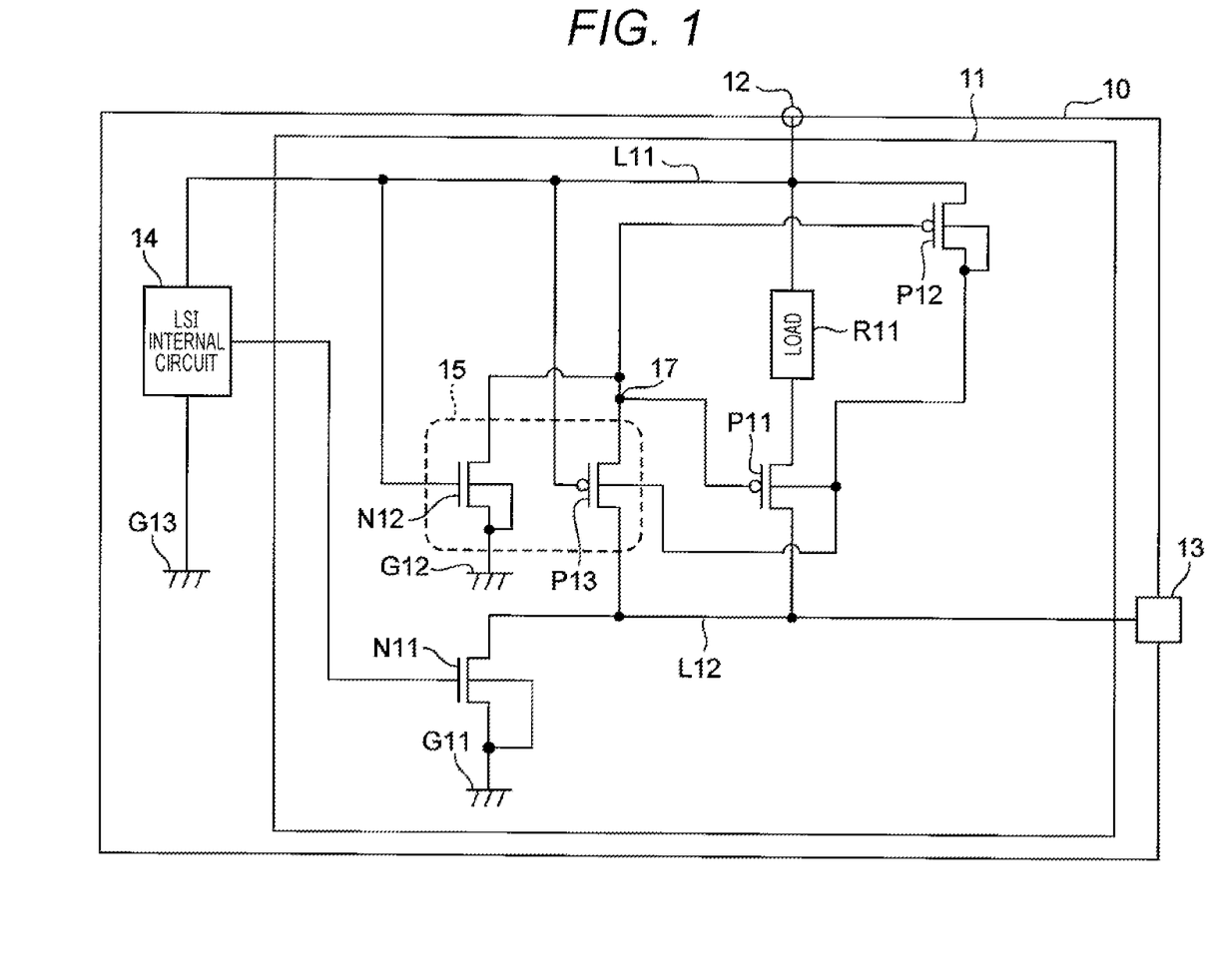
FIG. 1 is a circuit diagram of a sensor device according to a first embodiment.

FIG. 1 is a circuit diagram of the sensor device according to the first embodiment. Note that the sensor device is, for example, an airflow sensor, but is not particularly limited as long as it is a device whose electrical characteristics change according to a physical quantity.

As illustrated in FIG. 1, the sensor device 10 is connected to a host device such as an electronic control unit (ECU) (not illustrated) via a power terminal 12 and a signal terminal 13, and includes a large scale integration (LSI) internal circuit (detection circuit) 14 on which a sensor element is mounted and a control circuit 11 that processes a detection signal from the sensor element. The LSI internal circuit 14 is connected to a power line L11 connected to the power terminal 12, and receives a power supply voltage from the host device through the power line L11 to operate the sensor element or the like. In addition, the LSI internal circuit 14 performs various processing on a physical quantity detected by the sensor element, and outputs a control signal according to the physical quantity to the control circuit 11.

The control circuit 11 receives the power supply voltage from the host device via the power line L11 connected to the power terminal 12, and outputs an output signal according to the control signal of the LSI internal circuit 14 to the host device via a signal line L12 connected to the signal terminal 13. The control circuit 11 includes a first N-channel metal oxide semiconductor (NMOS) transistor N11 for circuit driving provided between the signal line L12 and a ground G11. In addition, the control circuit 11 includes a load R11 for current adjustment connected to the power line L11, a first P-channel metal oxide semiconductor (PMOS) transistor (first transistor) P11 for current cut-off provided between the load R11 and the signal line L12, and a second PMOS transistor (second transistor) P12 for well control provided between a well of the first PMOS transistor P11 and the power line L11.

Further, the control circuit 11 includes a gate control circuit 15 that turns off the first and second PMOS transistors P11 and P12 at the time of disconnection of a power supply. The gate control circuit 15 includes a second NMOS transistor N12 and a third PMOS transistor P13. The second NMOS transistor N12 is provided between a connection point 17 between a gate terminal of the first PMOS transistor P11 and a gate terminal of the second PMOS transistor P12 and a ground G12. The third PMOS transistor P13 is provided between a connection point 17 between the gate terminal of the first PMOS transistor P11 and the gate terminal of the second PMOS transistor P12 and the signal line L12.

More specifically, a drain terminal of the first NMOS transistor N11 for circuit driving is connected to the signal line L12, and a source terminal of the first NMOS transistor N11 is connected to the ground G11. The LSI internal circuit 14 is connected to a gate terminal of the first NMOS transistor N11, and the first NMOS transistor N11 is driven by receiving a control signal from the LSI internal circuit 14. The first NMOS transistor N11 is turned on/off according to the control signal from the LSI internal circuit 14, and generates an output signal according to the physical quantity detected by the sensor element in the LSI internal circuit 14.

The first PMOS transistor P11 for current cut-off has one input/output terminal connected to the load R11 and the other input/output terminal connected to the signal line L12. The first PMOS transistor P11 is used to cut a current path from the signal line L12 to the power line L11. The second PMOS transistor P12 for well control has one input/output terminal connected to the power line L11, and the other input/output terminal connected to wells of the first to third PMOS transistors P11 to P13. The second PMOS transistor P12 fixes well potentials of the first to third PMOS transistors P11 to P13 to constant potentials.

The second NMOS transistor N12 of the gate control circuit 15 has a drain terminal connected to the gate terminals of the first and second PMOS transistors P11 and P12 and a source terminal connected to its own well and the ground G12. A gate terminal of the second NMOS transistor N12 is connected to the power line L11. The second NMOS transistor N12 is turned on at the time of a normal operation in which a gate potential of the second NMOS transistor N12 becomes a power supply potential. As a result, the gate terminals of the first and second PMOS transistors P11 and P12 are connected to the ground G12, and the first and second PMOS transistors P11 and P12 are turned on.

The third PMOS transistor P13 of the gate control circuit 15 has one input/output terminal connected to the gate terminals of the first and second PMOS transistors P11 and P12 and the other input/output terminal connected to the signal line L12.

A gate terminal of the third PMOS transistor P13 is connected to the power line L11. The third PMOS transistor P13 is turned on at the time of disconnection of a power supply in which a gate potential of the third PMOS transistor P13 becomes a ground potential. As a result, the gate terminals of the first and second PMOS transistors P11 and P12 are connected to the signal line L12, and the first and second PMOS transistors P11 and P12 are turned off.

As described above, in the sensor device 10 according to the present embodiment, the first and second PMOS transistors P11 and P12 are turned off by the gate control circuit 15 at the time of the disconnection of the power supply so that a current does not sneak from the signal line L12 to the power line L11 at the time of the disconnection of the power supply. A direct current (DC) path from the signal line L12 to the power line L11 is cut by the first PMOS transistor P11. Current paths from the signal line L12 to the power line L11 through parasitic diodes D1 and D2 (see FIG. 3) of the first and third PMOS transistors P11 and P13 are cut by the second PMOS transistor P12. As a result, an output of an intermediate potential that may affect the LSI internal circuit 14 is prevented.

Hereinafter, a control circuit at the time of a normal operation and at the time of disconnection of a power supply will be described with reference to FIGS. 2 and 3. FIG. 2 is an explanatory diagram at the time of a normal operation according to the first embodiment. FIG. 3 is an explanatory diagram at the time of disconnection of a power supply according to the first embodiment.

Figure 2:
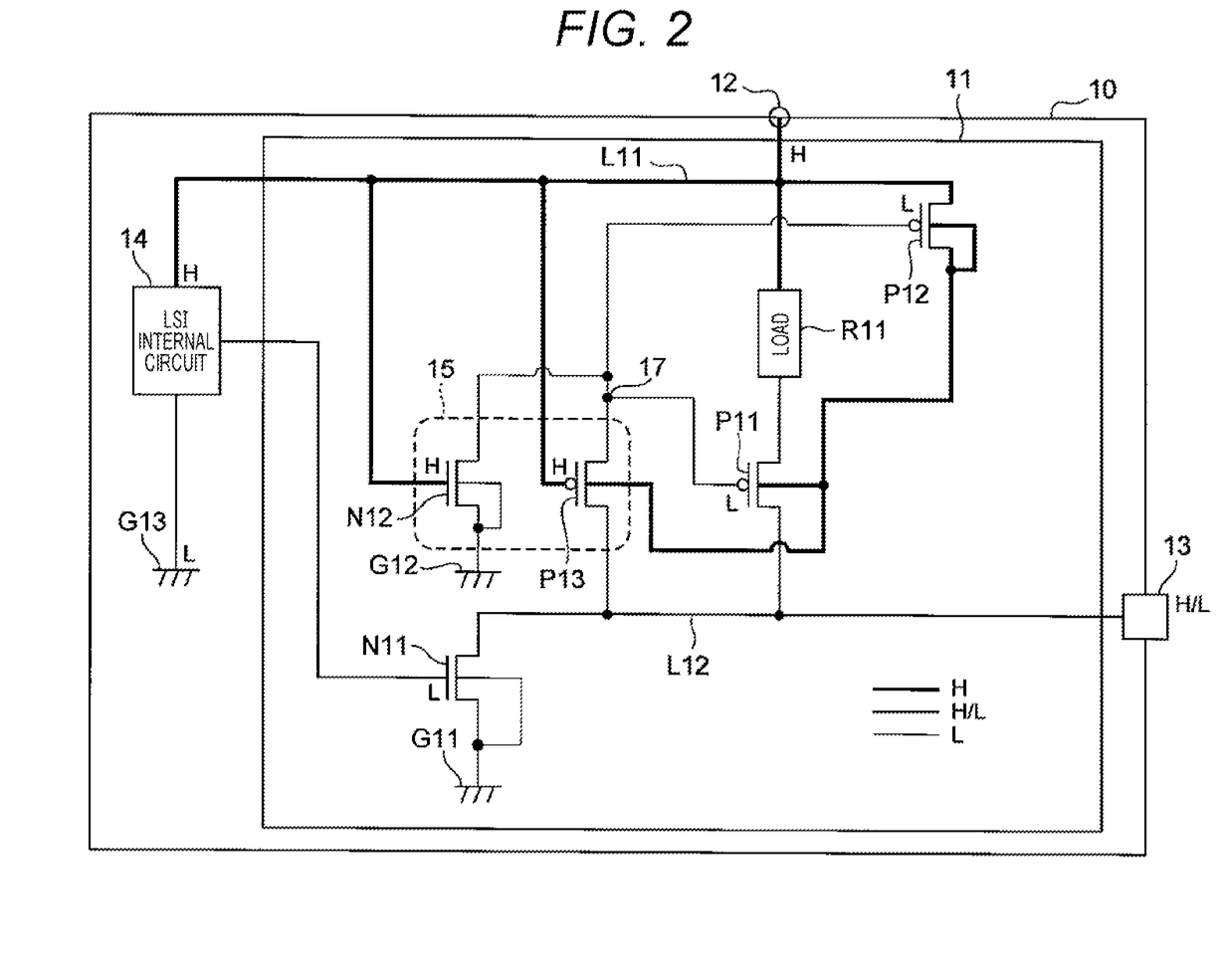
FIG. 2 is an explanatory diagram at the time of a normal operation according to the first embodiment.

As illustrated in FIG. 2, at the time of the normal operation, a power supply voltage is applied to the gate terminal of the second NMOS transistor N12 and the gate terminal of the third PMOS transistor P13 of the gate control circuit 15. The gate potential of the second NMOS transistor N12 becomes the power supply potential, such that the second NMOS transistor N12 is turned on, and the gate potential of the third PMOS transistor P13 becomes the power supply potential, such that the third PMOS transistor P13 is turned off. The second NMOS transistor N12 is turned on and the third PMOS transistor P13 is turned off, such that the gate terminals of the first and second PMOS transistors P11 and P12 are connected to the ground G12.

Gate potentials of the first and second PMOS transistors P11 and P12 become a ground potential, and well potentials of the first and second PMOS transistors P11 and P12 are fixed to the power supply potential, such that a conduction state of the first and second PMOS transistors P11 and P12 is maintained. At this time, in the first PMOS transistor P11, one input/output terminal connected to the load R11 acts as a source, and the other input/output terminal connected to the signal line L12 acts as a drain. In addition, in the second PMOS transistor P12, one input/output terminal connected to the power line L11 acts as a source, and the other input/output terminal connected to the wells of the respective PMOS transistors P11 to P13 acts as a drain.

In addition, the second PMOS transistor P12 is turned on, such that the well potential of the third PMOS transistor P13 is fixed to the power supply potential and a turned-off state of the third PMOS transistor P13 is maintained. As a result, the signal line L12 is not connected to the ground G12 via the third PMOS transistor P13 and the second NMOS transistor N12. As described above, at the time of the normal operation, the gate terminal of the first PMOS transistor P11 is connected to the ground G12 and the well potential of the first PMOS transistor P11 is made to become the power supply potential, such that a conduction state of the first PMOS transistor P11 is maintained.

Figure 3:
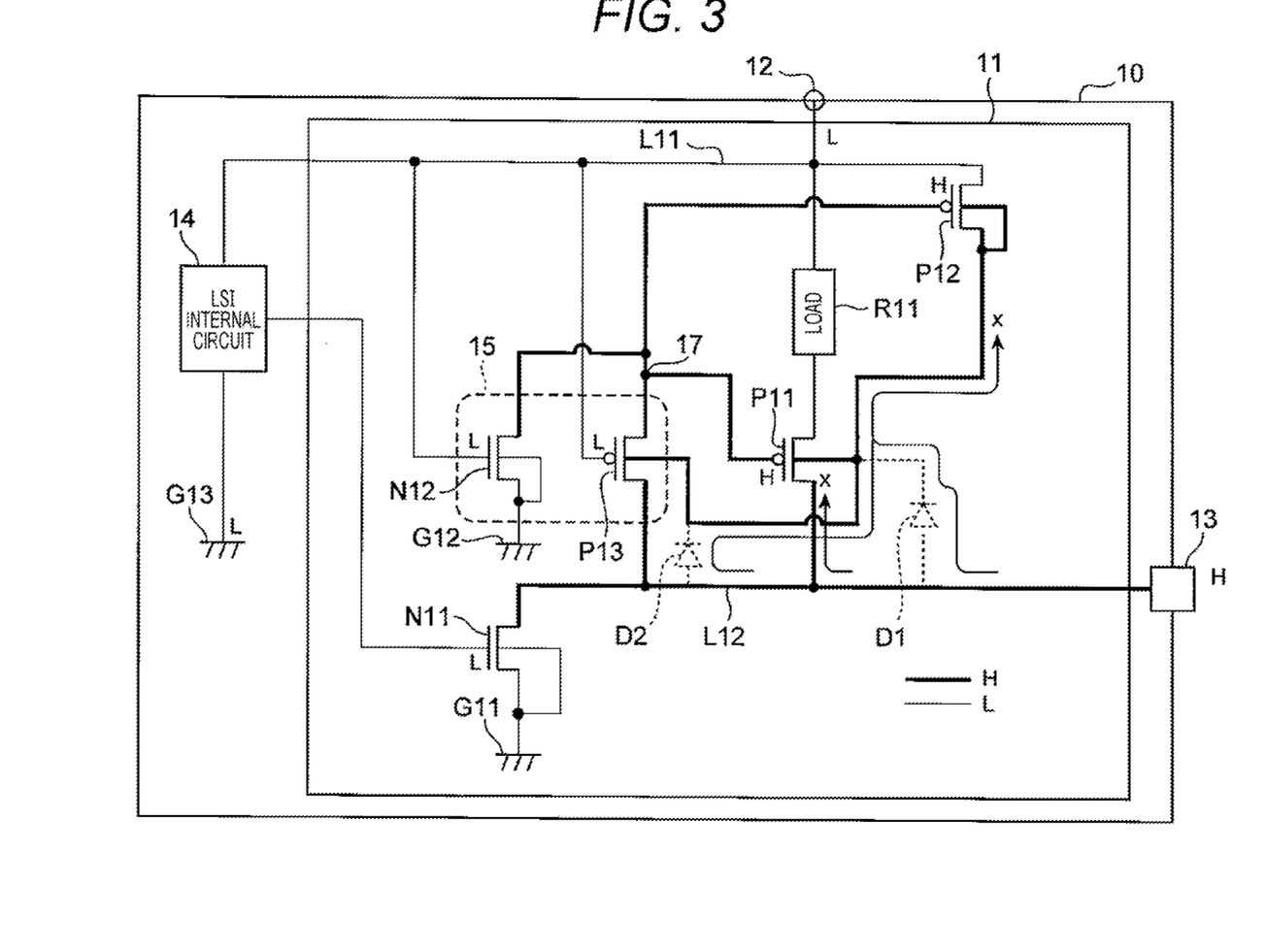
FIG. 3 is an explanatory diagram at the time of disconnection of a power supply according to the first embodiment.

As illustrated in FIG. 3, at the time of the disconnection of the power supply, the gate terminal of the second NMOS transistor N12 and the gate terminal of the third PMOS transistor P13 of the gate control circuit 15 are connected to a ground G13 via a load of the LSI internal circuit 14. The gate potential of the second NMOS transistor N12 becomes the ground potential, such that the second NMOS transistor N12 is turned off, and the gate potential of the third PMOS transistor P13 becomes the ground potential, such that the third PMOS transistor P13 is turned on. The second NMOS transistor N12 is turned off and the third PMOS transistor P13 is turned on, such that the gate terminals of the first and second PMOS transistors P11 and P12 are connected to the signal line L12.

Normally, signal potentials are pulled up, and thus, the gate potentials of the first and second PMOS transistors P11 and P12 become the signal potentials through the third PMOS transistor P13.

In addition, the well potentials of the first to third PMOS transistors P11 to P13 are fixed to potentials lowered from the signal potentials by the parasitic diode D1 of the first PMOS transistor P11. In this case, threshold voltages of the first and second PMOS transistors P11 and P12 are lowered, but gate-source voltages of the first and second PMOS transistors P11 and P12 are lower than the threshold voltages, and the first and second PMOS transistors P11 and P12 are thus maintained in a turned-off state.

At the time of the disconnection of the power supply, a source and a drain of a pair of input/output terminals of the first PMOS transistor P11 are exchanged and a source and a drain of a pair of input/output terminals of the second PMOS transistor P12 are exchanged, from the normal operation. In the first PMOS transistor P11, one input/output terminal connected to the load R11 acts as a drain, and the other input/output terminal connected to the signal line L12 acts as a source. In addition, in the second PMOS transistor P12, one input/output terminal connected to the power line L11 acts as a drain, and the other input/output terminal connected to the wells of the PMOS transistors P11 to P13 acts as a source.

Then, the first PMOS transistor P11 is maintained in the turned-off state, such that a DC path of a current from the signal line L12 to the power line L11 is cut. A current path is formed in the first PMOS transistor P11 by the parasitic diode D1 illustrated by a broken line, but the second PMOS transistor P12 is maintained in the turned-off state, such that the current path from the signal line L12 to the power line L11 through the parasitic diode D1 is cut. Similarly, a current path is also formed in the third PMOS transistor P13 by the parasitic diode D2 illustrated by a broken line, but the current path from the signal line L12 to the power line L11 through the parasitic diode D2 is cut by the second PMOS transistor P12.

The second PMOS transistor P12 controls the wells of the respective PMOS transistors P11 to P13 and cuts current paths of the parasitic diodes D1 and D2 of the first and third PMOS transistors P11 and P13. Therefore, it is not necessary to prepare transistors separately for controlling the wells of the first and third PMOS transistors P11 and P13 and for cutting the current paths of the parasitic diodes D1 and D2. It becomes possible to reduce an area of a chip by making the wells of the respective PMOS transistors P11 to P13 common. Note that in the present embodiment, transistors may be separately prepared for controlling the wells of the first and third PMOS transistors P11 and P13.

As described above, in the first embodiment, at the time of the disconnection of the power supply, the gate potentials of the first and second PMOS transistors P11 and P12 become the signal potentials, and the well potentials of the first and second PMOS transistors P11 and P12 are fixed to predetermined potentials. The first PMOS transistor P11 is turned off, such that the DC path from the signal line L12 to the power line L11 is cut. In addition, the second PMOS transistor P12 is turned off, such that the current paths from the signal line L12 to the power line L11 through the parasitic diodes D1 and D2 of the first and third PMOS transistors P11 and P13 are cut. Therefore, the sneaking of the current from the signal line L12 to the power line L11 is suppressed, such that the output of the intermediate potential is prevented. By preventing the output of the intermediate potential, damage to the LSI and an erroneous diagnosis of an output signal by the host device are suppressed.

Second Embodiment

Figure 4:
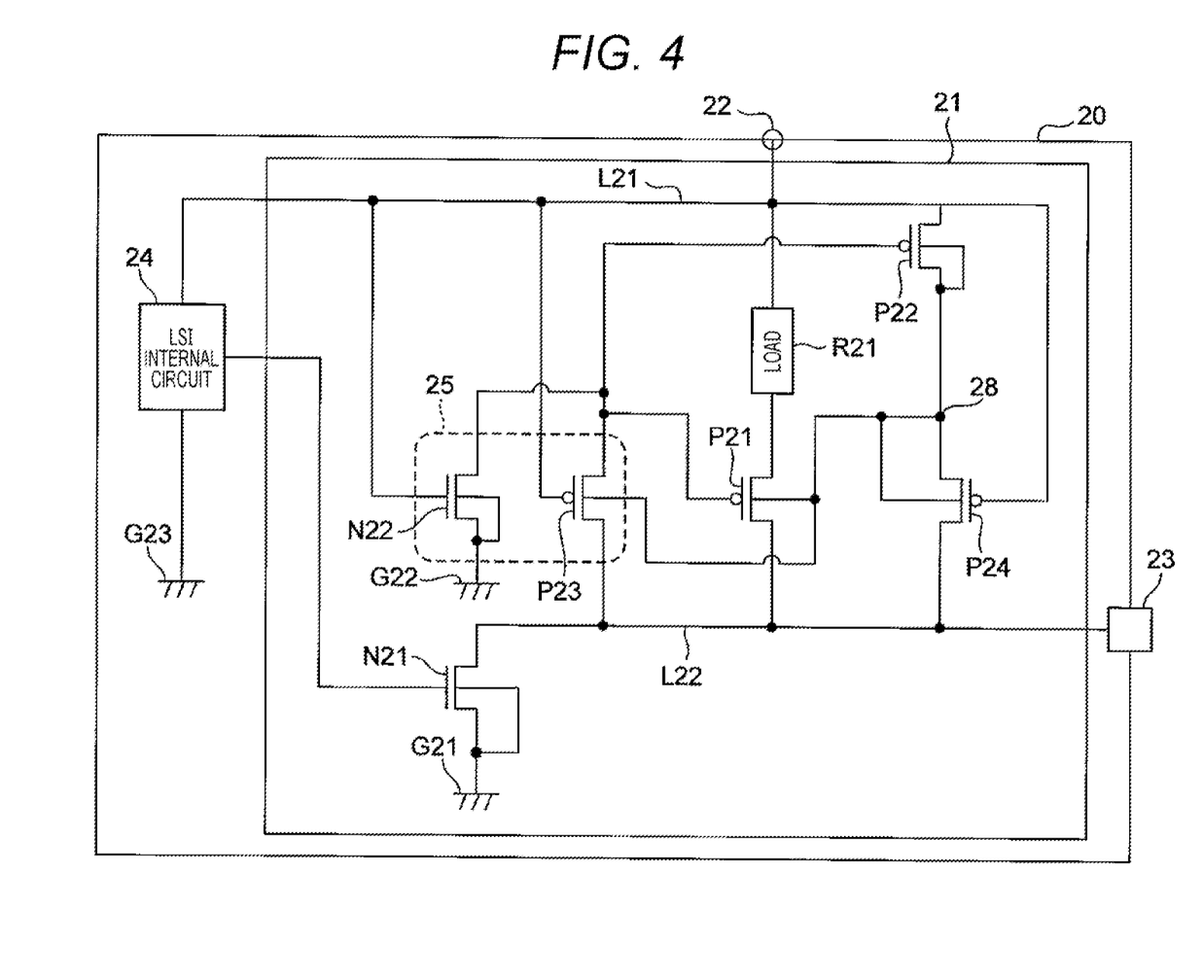
FIG. 4 is a circuit diagram of a sensor device according to a second embodiment.

A sensor device according to a second embodiment will be described with reference to FIG. 4. In the first embodiment, at the time of the disconnection of the power supply, the well potentials of the respective PMOS transistors are fixed to the potentials lowered from the signal potentials by the parasitic diodes. For this reason, the threshold voltage drops, such that a slight leakage current may occur at the time of cutting off the current. Therefore, the sensor device according to the second embodiment includes a fourth PMOS transistor for well control at the time of disconnection of a power supply. Here, a description for a configuration similar to that of the first embodiment will be omitted as much as possible. FIG. 4 is a circuit diagram of the sensor device according to the second embodiment.

As illustrated in FIG. 4, the sensor device 20 according to the second embodiment is different from the sensor device according to the first embodiment in that it includes a fourth PMOS transistor P24 for well control at the time of the disconnection of the power supply. That is, a control circuit 21 includes a load R21, first and second NMOS transistors N21 and N22, and first to third PMOS transistors P21 to P23, similar to the control circuit 11 of the first embodiment. In addition, the control circuit 21 includes the fourth PMOS transistor P24 for well control at the time of the disconnection of the power supply, provided between a connection point 28 between a well of the first PMOS transistor P21 and a well of the second PMOS transistor P22 and a signal line L22.

The fourth PMOS transistor P24 has one input/output terminal connected to wells of the respective PMOS transistors P21 to P24 and the other input/output terminal connected to the signal line L22.

A gate terminal of the fourth PMOS transistor P24 is connected to a power line L21. In the fourth PMOS transistor P24, at the time of a normal operation, one input/output terminal connected to the wells of the respective PMOS transistors P21 to P24 acts as a source, and the other input/output terminal connected to the signal line L22 acts as a drain. At the time of the disconnection of the power supply, one input/output terminal connected to the wells of the respective PMOS transistors P21 to P24 acts as a drain, and the other input/output terminal connected to the signal line L22 acts as a source.

At the time of the normal operation, a power supply voltage is applied to the gate terminal of the fourth PMOS transistor P24, such that a gate potential of the fourth PMOS transistor P24 becomes a power supply potential. In addition, the second PMOS transistor P22 is turned on, such that a well potential of the fourth PMOS transistor P24 is fixed to the power supply potential and a turned-off state of the fourth PMOS transistor P24 is maintained. As a result, the control circuit 21 of the second embodiment also operates, similar to the control circuit 11 of the first embodiment, and thus, an operation of the control circuit 21 is not adversely affected by the addition of the fourth PMOS transistor P24.

At the time of the disconnection of the power supply, the gate terminal of the fourth PMOS transistor P24 is connected to a ground G23 via a load of an LSI internal circuit 24. The gate potential of the fourth PMOS transistor P24 becomes a ground potential, and well potentials of the first to third PMOS transistors P21 to P23 are fixed to a signal potential through the fourth PMOS transistor P24. As a result, a voltage drop by the parasitic diode of the first PMOS transistor P21 as in the first embodiment is eliminated, such that threshold voltages of the first and second PMOS transistors P21 and P22 rise, and a leakage current at the time of cutting off a current can thus be reduced.

As described above, also in the second embodiment, it is possible to suppress sneaking of a current from the signal line L22 to the power line L21 at the time of the disconnection of the power supply, similar to the first embodiment. In addition, at the time of the disconnection of the power supply, a current cut-off effect of the first and second PMOS transistors P21 and P22 can be enhanced by the fourth PMOS transistor P24.

Third Embodiment

Figure 5:
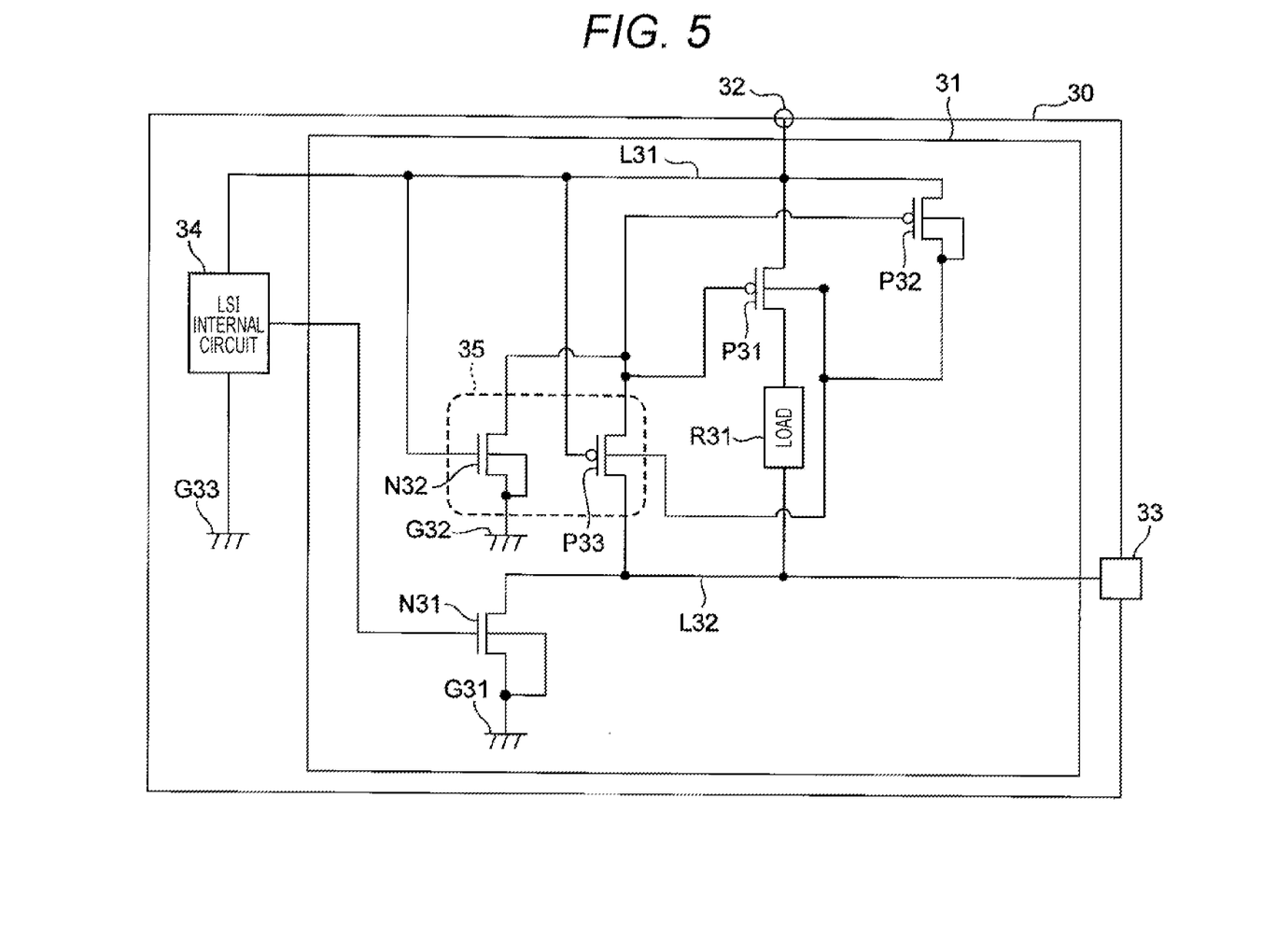
FIG. 5 is a circuit diagram of a sensor device according to a third embodiment.

A sensor device according to a third embodiment will be described with reference to FIG. 5. In the first embodiment, since the first PMOS transistor is provided between the load and the signal line, the gate-source voltage of the first PMOS transistor becomes small due to the load, such that it was not possible to sufficiently reduce the area of the chip. Therefore, the sensor device according to the third embodiment includes a first PMOS transistor provided between a power line and a load. Here, a description for a configuration similar to that of the first embodiment will be omitted as much as possible. FIG. 5 is a circuit diagram of the sensor device according to the third embodiment.

As illustrated in FIG. 5, the sensor device 30 according to the third embodiment is different from the sensor device according to the first embodiment in that positions of a first PMOS transistor P31 and a load R31 are exchanged. That is, a control circuit 31 includes a load R31, first and second NMOS transistors N31 and N32, and first to third PMOS transistors P31 to P33, similar to the control circuit 11 of the first embodiment. Since the first PMOS transistor P31 is provided between a power line L31 and the load R31, a gate-source voltage of the first PMOS transistor P31 becomes large at the time of a normal operation. Therefore, a turn-on resistance of the first PMOS transistor P31 can be reduced, such that an area of a chip can be reduced.

As described above, also in the third embodiment, it is possible to suppress sneaking of a current from a signal line L32 to the power line L31 at the time of disconnection of a power supply, similar to the first embodiment. In addition, the area of the chip of the first PMOS transistor P31 can be reduced.

Fourth Embodiment

In each of the embodiments described above, the second NMOS transistor has been exemplified as a first element of the gate control circuit and the third PMOS transistor has been exemplified as a second element of the gate control circuit, but the gate control circuit is not limited to this configuration. The gate control circuit is only required to include a first element that connects gate terminals of first and second PMOS transistors to a ground at the time of a normal operation and a second element that connects the gate terminals of the first and second PMOS transistors to a signal line at the time of disconnection of a power supply.

Figure 6:
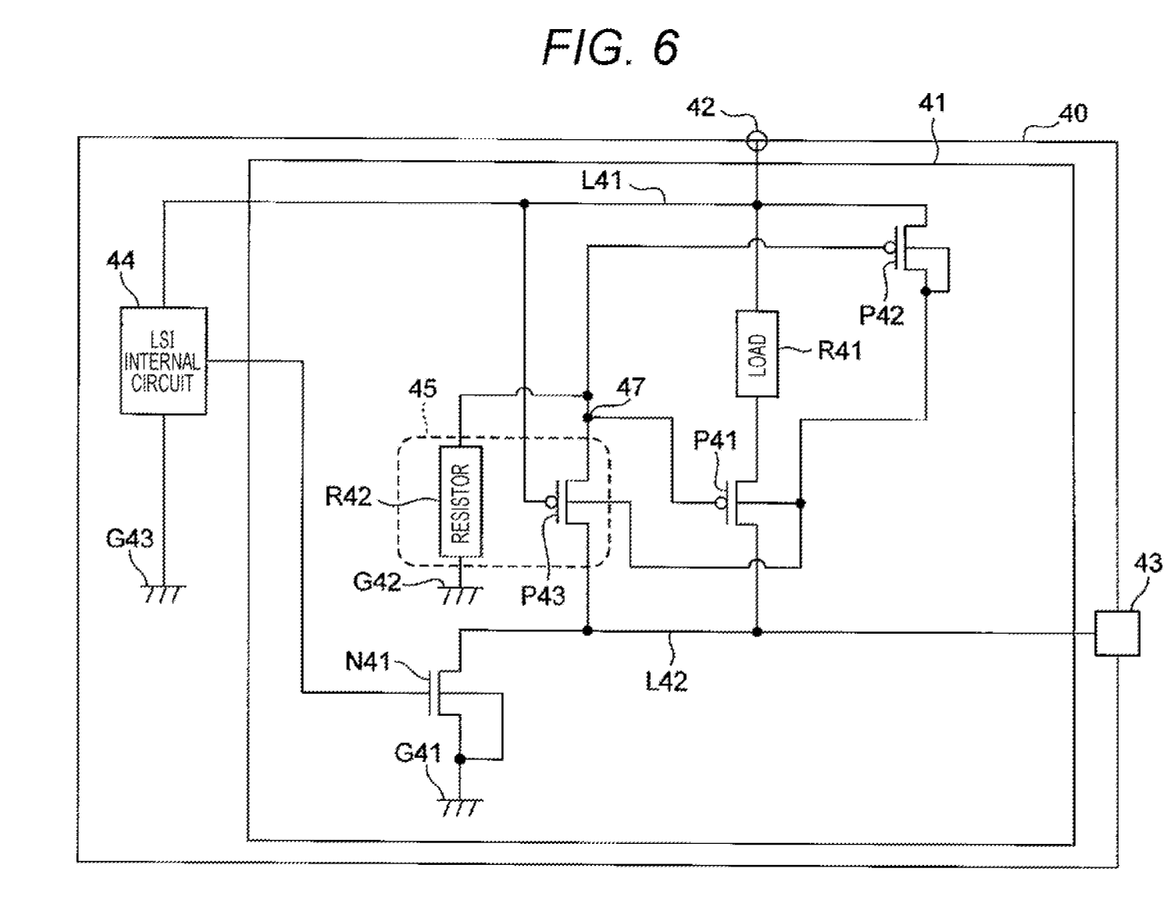
FIG. 6 is a circuit diagram of a sensor device according to a fourth embodiment.

For example, as illustrated in FIG. 6, the first element of the gate control circuit may be composed of a resistor.

A sensor device according to a fourth embodiment will be described with reference to FIG. 6. The sensor device according to the fourth embodiment uses a resistor as the first element of the gate control circuit and uses a PMOS transistor as the second element of the gate control circuit. Here, a description for a configuration similar to that of the first embodiment will be omitted as much as possible. FIG. 6 is a circuit diagram of the sensor device according to the fourth embodiment.

As illustrated in FIG. 6, the sensor device 40 according to the fourth embodiment is different from the sensor device according to the first embodiment in that the second NMOS transistor N12 (see FIG. 1) is replaced with a resistor R42. That is, a control circuit 41 includes a load R41, a first NMOS transistor N41, and first to third PMOS transistors P41 to P43, similar to the control circuit 11 of the first embodiment. The resistor R42 of the gate control circuit 45 is provided between a connection point 47 between gate terminals of the first and second PMOS transistors P41 and P42 and a ground G42.

In addition, a resistance value of the resistor R42 is set to be larger than a resistance value of a turn-on resistance of the third PMOS transistor P43.

At the time of a normal operation, a power supply voltage is applied to a gate terminal of the third PMOS transistor P43 of the gate control circuit 45. A gate potential of the third PMOS transistor P43 becomes a power supply potential, such that the third PMOS transistor P43 is turned off. For this reason, the gate terminals of the first and second PMOS transistors P41 and P42 are connected to the ground G42 via the resistor R42. Gate potentials of the first and second PMOS transistors P41 and P42 become a ground potential, and well potentials of the first and second PMOS transistors P41 and P42 are fixed to the power supply potential, such that a conduction state of the first and second PMOS transistors P41 and P42 is maintained.

At the time of disconnection of a power supply, the gate terminal of the third PMOS transistor P43 of the gate control circuit 45 is connected to a ground G43 via a load of an LSI internal circuit 44. The gate potential of the third PMOS transistor P43 becomes a ground potential, such that the third PMOS transistor P43 is turned on. Since the third PMOS transistor P43 is turned on and a resistance value of the resistor R42 is set to be high, the gate terminals of the first and second PMOS transistors P41 and P42 are connected to a signal line L42. The gate potentials of the first and second PMOS transistors P41 and P42 become signal potentials, such that a turned-off state of the first and second PMOS transistors P41 and P42 is maintained.

As described above, also in the fourth embodiment, it is possible to suppress sneaking of a current from the signal line L42 to a power line L41 at the time of the disconnection of the power supply, similar to the first embodiment. In addition, the gate control circuit 45 can be composed of the resistor R42 and the third PMOS transistor P43.

Fifth Embodiment

Figure 7:
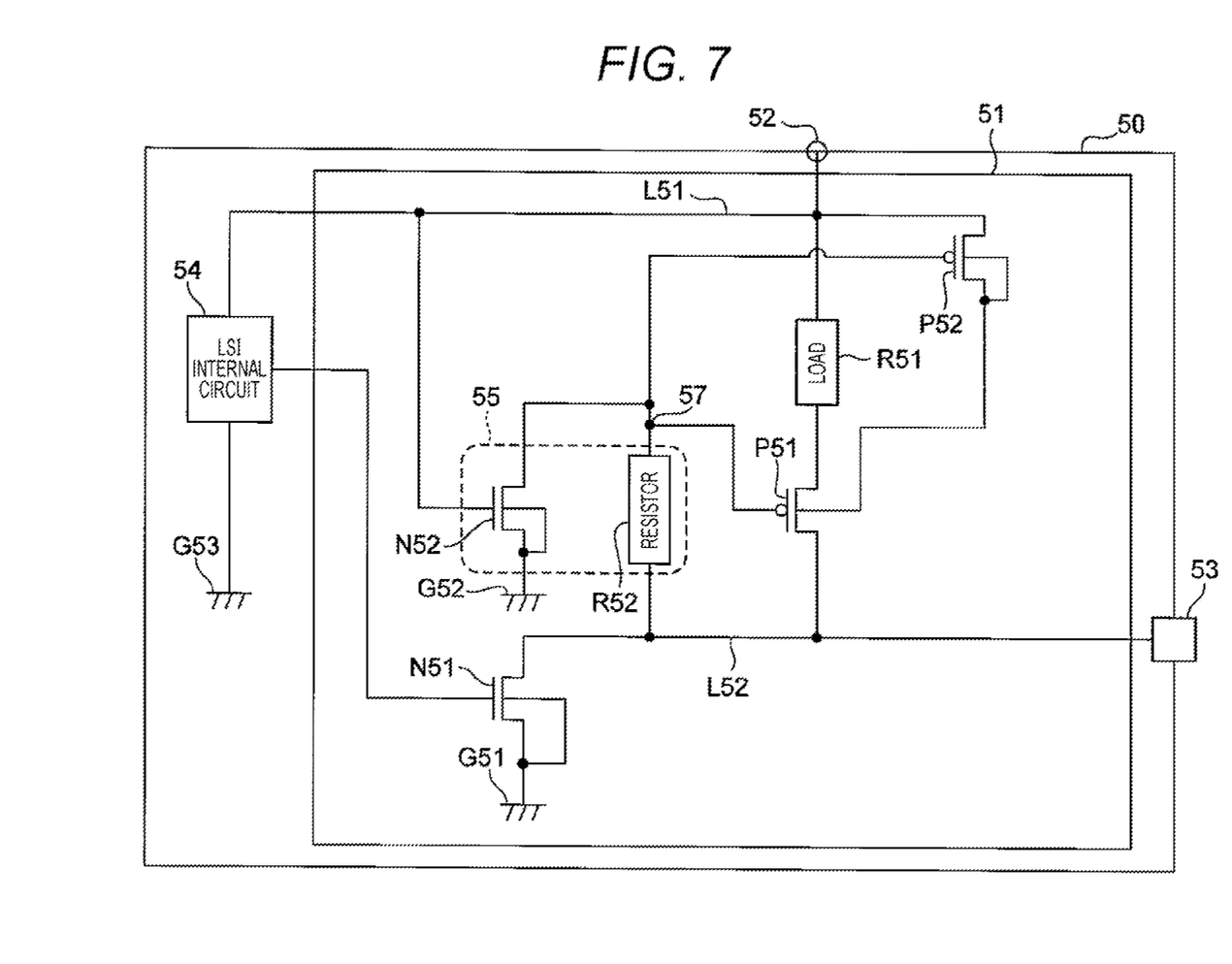
FIG. 7 is a circuit diagram of a sensor device according to a fifth embodiment.

In addition, as illustrated in FIG. 7, the second element of the gate control circuit may be composed of a resistor. A sensor device according to a fifth embodiment will be described with reference to FIG. 7. The sensor device according to the fifth embodiment uses an NMOS transistor as the first element of the gate control circuit and uses a resistor as the second element of the gate control circuit.

Here, a description for a configuration similar to that of the first embodiment will be omitted as much as possible. FIG. 7 is a circuit diagram of the sensor device according to the fifth embodiment.

As illustrated in FIG. 7, the sensor device 50 according to the fifth embodiment is different from the sensor device according to the first embodiment in that the third PMOS transistor P13 (see FIG. 1) is replaced with a resistor R52. That is, a control circuit 51 includes a load R51, first and second NMOS transistors N51 and N52, and first and second PMOS transistors P51 and P52, similar to the control circuit 11 of the first embodiment. The resistor R52 of the gate control circuit 55 is provided between a connection point 57 between gate terminals of the first and second PMOS transistors P51 and P52 and a signal line L52. In addition, a resistance value of the resistor R52 is set to be larger than a resistance value of a combined resistance of the load R51 and a turn-on resistance of the first PMOS transistor P51.

At the time of a normal operation, a power supply voltage is applied to a gate terminal of the second NMOS transistor N52 of the gate control circuit 55. A gate potential of the second NMOS transistor N52 becomes a power supply potential, such that the second NMOS transistor N52 is turned on. Since the resistance value of the resistor R52 is set to be high, the gate terminals of the first and second PMOS transistors P51 and P52 are connected to a ground G52 via the second NMOS transistor N52. Gate potentials of the first and second PMOS transistors P51 and P52 become a ground potential, and well potentials of the first and second PMOS transistors P51 and P52 are fixed to the power supply potential, such that a conduction state of the first and second PMOS transistors P51 and P52 is maintained.

At the time of disconnection of a power supply, the gate terminal of the second NMOS transistor N52 of the gate control circuit 55 is connected to a ground G53 via a load of an LSI internal circuit 54. A gate potential of the second NMOS transistor N52 becomes a ground potential, such that the second NMOS transistor N52 is turned off. By cutting off the second NMOS transistor N52, the gate terminals of the first and second PMOS transistors P51 and P52 are connected to the signal line L52 via the resistor R52. The gate potentials of the first and second PMOS transistors P51 and P52 become high, such that a turned-off state of the first and second PMOS transistors P51 and P52 is maintained.

As described above, also in the fifth embodiment, it is possible to suppress sneaking of a current from the signal line L52 to a power line L51 at the time of the disconnection of the power supply, similar to the first embodiment. In addition, the gate control circuit 55 can be composed of the second NMOS transistor N52 and the resistor R52.

Sixth Embodiment

Figure 8:
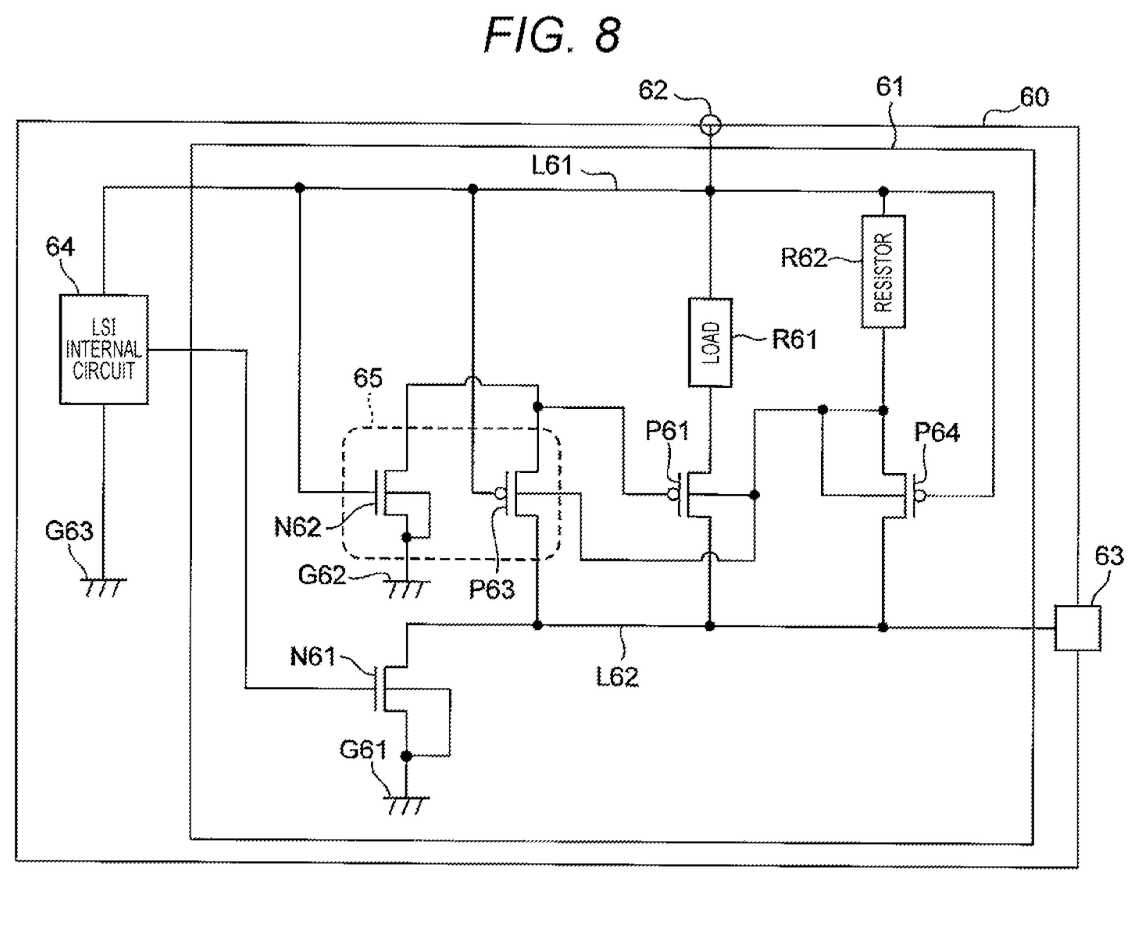
FIG. 8 is a circuit diagram of a sensor device according to a sixth embodiment.

A configuration in which the well control is performed by the second and fourth PMOS transistors has been exemplified in the second embodiment described above, but the present invention is not limited to this configuration. For example, as illustrated in FIG. 8, a second PMOS transistor turned on at the time of a normal operation may be replaced with a resistor. A sensor device according to a sixth embodiment will be described with reference to FIG. 8. Here, a description for a configuration similar to that of the second embodiment will be omitted as much as possible. FIG. 8 is a circuit diagram of the sensor device according to the sixth embodiment.

As illustrated in FIG. 8, the sensor device 60 according to the sixth embodiment is different from the sensor device according to the second embodiment in that the second PMOS transistor P22 (see FIG. 4) for well control is replaced with a resistor R62. That is, a control circuit 61 includes a load R61, first and second NMOS transistors N61 and N62, and first, third, and fourth PMOS transistors P61, P63, and P64, similar to the control circuit 21 of the second embodiment. The resistor R62 for well control is provided between a power line L61 and the fourth PMOS transistor P64. A resistance value of the resistor R62 is set to be larger than a resistance value of the pull-up resistor of a host device such as an ECU (not illustrated).

At the time of the normal operation, a power supply voltage is applied to a gate terminal of the fourth PMOS transistor P64, such that a gate potential of the fourth PMOS transistor P64 becomes a power supply potential. Since the fourth PMOS transistor P64 is turned off, well potentials of the first, third, and fourth PMOS transistors P61, P63, and P64 are fixed to high potentials via the resistor R62 for well control. A conduction state of the first PMOS transistor P61 is maintained, and a turned-off state of the third and fourth PMOS transistors P63 and P64 is maintained. As a result, the well potentials of the PMOS transistors P61, P63, and P64 can be controlled by the resistor R62 and the fourth PMOS transistor P64, similar to the control circuit 11 of the first embodiment.

At the time of disconnection of a power supply, the gate terminal of the fourth PMOS transistor P64 is connected to a ground G63 via a load of an LSI internal circuit 64. The gate potential of the fourth PMOS transistor P64 becomes a ground potential, such that the fourth PMOS transistor P64 is turned on. Since the resistance value of the resistor R62 is set to be high, the well potentials of the first, third, and fourth PMOS transistors P61, P63, and P64 are fixed to signal potentials through the fourth PMOS transistor P64. As a result, a voltage drop by the parasitic diode of the first PMOS transistor P61 as in the first embodiment is eliminated, such that a threshold voltage of the first PMOS transistor P61 rises and a leakage current at the time of cutting off a current can thus be reduced, similar to the second embodiment.

As described above, also in the sixth embodiment, it is possible to suppress sneaking of a current from a signal line L62 to the power line L61 at the time of the disconnection of the power supply, similar to the second embodiment. In addition, the well potentials of the first, third, and fourth PMOS transistors P61, P63, and P64 can be controlled by the resistor R62 and the fourth PMOS transistor P64.

Seventh Embodiment

Figure 9:
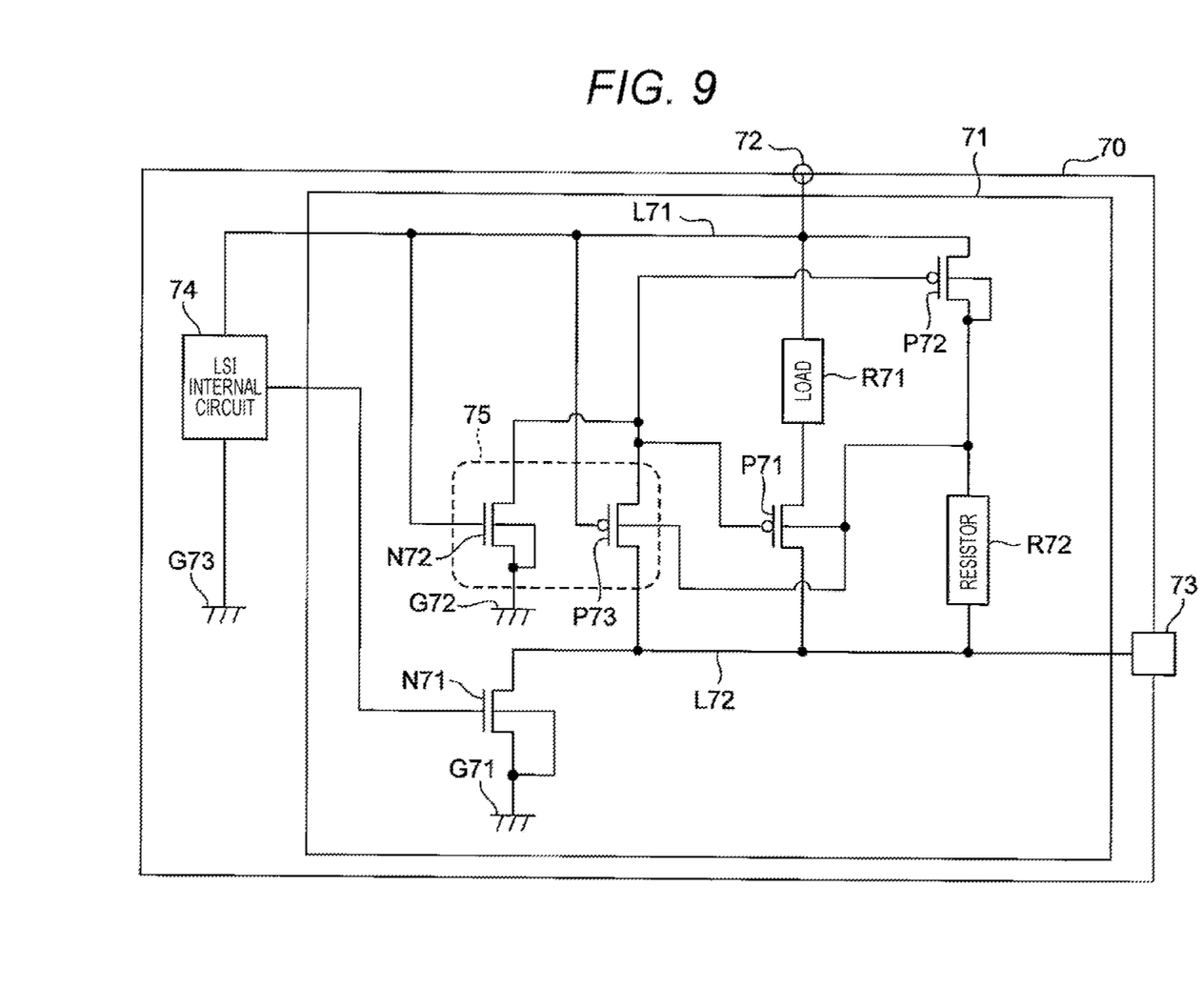
FIG. 9 is a circuit diagram of a sensor device according to a seventh embodiment.

In addition, as illustrated in FIG. 9, a fourth PMOS transistor turned on at the time of disconnection of a power supply may be replaced with a resistor. A sensor device according to a seventh embodiment will be described with reference to FIG. 9. Here, a description for a configuration similar to that of the second embodiment will be omitted as much as possible. FIG. 9 is a circuit diagram of the sensor device according to the seventh embodiment.

As illustrated in FIG. 9, the sensor device 70 according to the seventh embodiment is different from the sensor device according to the second embodiment in that the fourth PMOS transistor P24 (see FIG. 4) for well control is replaced with a resistor R72. That is, a control circuit 71 includes a load R71, first and second NMOS transistors N71 and N72, and first to third PMOS transistors P71 to P73, similar to the control circuit 21 of the second embodiment.

The resistor R72 for well control is provided between the second PMOS transistor P72 and a signal line L72.

At the time of a normal operation, a gate terminal of the second PMOS transistor P72 is connected to a ground G72 through the second NMOS transistor N72 of a gate control circuit 75, such that a gate potential of the second PMOS transistor P72 becomes a ground potential. Therefore, well potentials of the first to third PMOS transistors P71 to P73 are fixed to a power supply potential via the second PMOS transistor P72. A conduction state of the first and second PMOS transistors P71 and P72 is maintained, and a turned-off state of the third PMOS transistor P73 is maintained.

Note that at the time of the normal operation, the first and second PMOS transistors P71 and P72 are turned on, such that a series circuit of the load R71 and the first PMOS transistor P71 and a series circuit of the second PMOS transistor P72 and the resistor R72 are formed in parallel between a power line L71 and the signal line L72. For this reason, resistance values of each element of a parallel circuit composed of two series circuits are set so as to satisfy a low voltage standard of a host device by voltage division between a resistance value of a combined resistance of the parallel circuit and a resistance value of a turn-on resistance of the first NMOS transistor N71 for circuit driving.

At the time of the disconnection of the power supply, the second PMOS transistor P72 is turned off, such that the well potentials of the first to third PMOS transistors P71 to P73 are controlled by the resistor R72.

As a result, the well potentials of the respective PMOS transistors P71 to P73 can be controlled by the second PMOS transistor P72 and the resistor R72, similar to the control circuit 21 of the second embodiment.

As described above, also in the seventh embodiment, it is possible to suppress sneaking of a current from the signal line L72 to the power line L71 at the time of the disconnection of the power supply, similar to the second embodiment. In addition, the well potentials of the first to third PMOS transistors P71 to P73 can be controlled by the second PMOS transistor P72 and the resistor R72.

Eighth Embodiment

Figure 10:
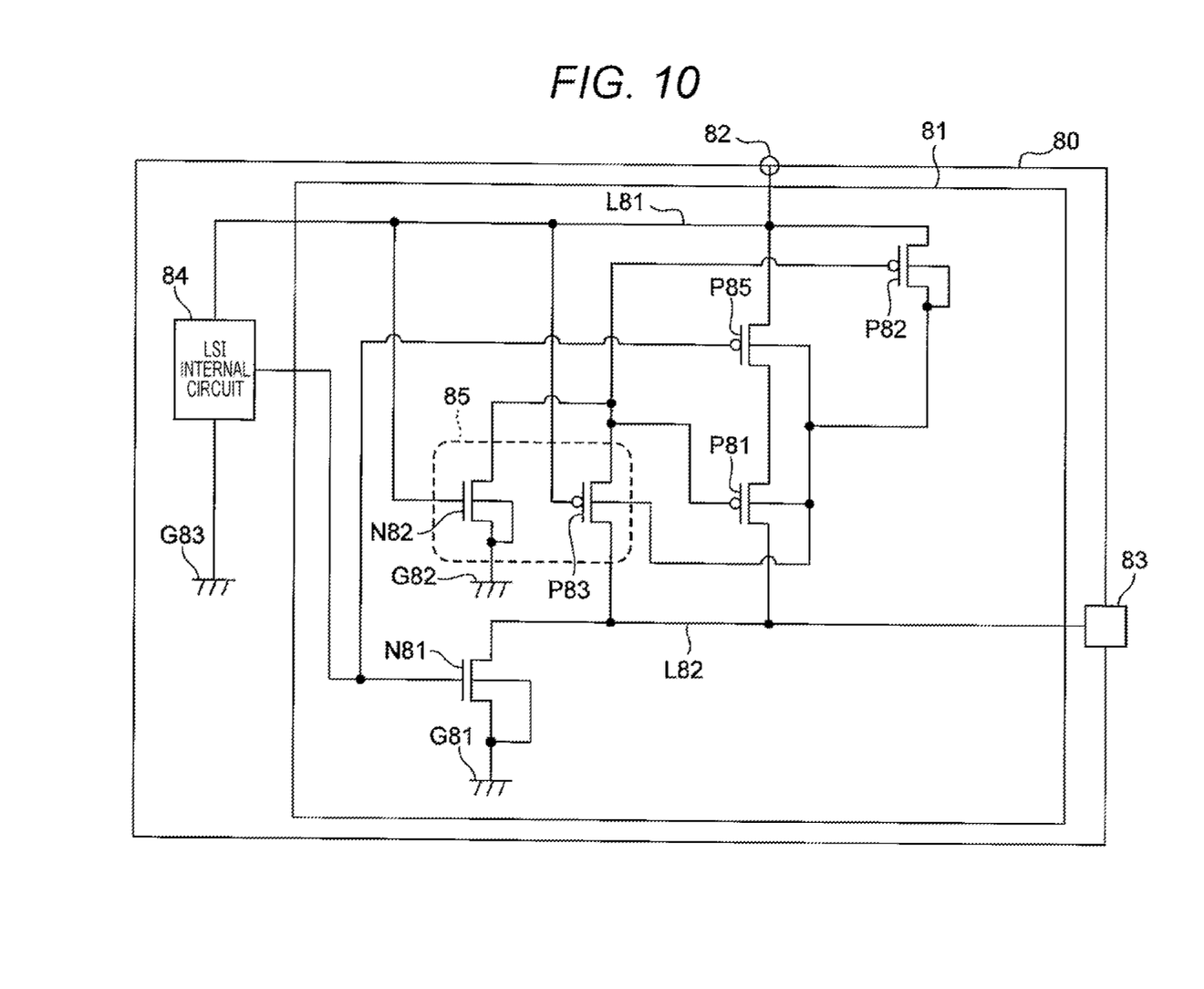
FIG. 10 is a circuit diagram of a sensor device according to an eighth embodiment.

A configuration in which the control circuit includes the load has been described in each of the embodiments described above, but the load may be composed of a resistor or may be composed of a transistor. For example, as illustrated in FIG. 10, the load may be composed of a PMOS transistor. A sensor device according to an eighth embodiment will be described with reference to FIG. 10. Here, a description for a configuration similar to that of the first embodiment will be omitted as much as possible. FIG. 10 is a circuit diagram of the sensor device according to the eighth embodiment.

As illustrated in FIG. 10, the sensor device 80 according to the eighth embodiment is different from the sensor device according to the first embodiment in that it includes a fifth PMOS transistor P85 as a load for current adjustment. That is, a control circuit 81 includes first and second NMOS transistors N81 and N82 and first to third PMOS transistors P81 to P83, similar to the control circuit 11 of the first embodiment. In addition, the control circuit 81 includes the fifth PMOS transistor P85 for current adjustment provided between a power line L81 and the first PMOS transistor P81. The load is composed of the transistor, such that a current adjustment effect is enhanced.

The fifth PMOS transistor P85 has one input/output terminal (source terminal) connected to the power line L81 and the other input/output terminal (drain terminal) connected to one input/output terminal of the first PMOS transistor P81. An LSI internal circuit 84 is connected to a gate terminal of the fifth PMOS transistor P85, and the fifth PMOS transistor P85 is driven by receiving a control signal from the LSI internal circuit 84. A well potential of the fifth PMOS transistor P85 is controlled by the second PMOS transistor P82. Therefore, it becomes possible to reduce an area of a chip by making wells of the respective PMOS transistors P81 to P83 and P85 common.

As described above, also in the eighth embodiment, it is possible to suppress sneaking of a current from a signal line L82 to the power line L81 at the time of disconnection of a power supply, similar to the first embodiment. In addition, the current adjustment effect can be enhanced by using the fifth PMOS transistor P85 as the load.

In addition, each sensor of the present embodiment may have a signal potential controlled by a pull-up circuit in order to correspond to a signal edge nibble transmission (SENT) standard. Even in a case where the power supply is disconnected in a state where the signal potential is always pulled up without using the pull-up circuit, it is possible to prevent the output of the intermediate potential by suppressing the sneaking of the current from the signal line to the power line.

The embodiments of the present invention have been described hereinabove, but the present invention is not limited to the embodiments described above, and various modifications can be made without departing from the spirit of the present invention described in the claims. For example, the embodiments described above have been described in detail in order to explain the present invention in an easy-to-understand manner, and are not necessarily limited to including all the components described. In addition, some of components of a certain embodiment can be replaced by components of another embodiment, and components of another embodiment can also be added to components of a certain embodiment. Further, it is possible to add, delete, and replace other components with respect to some of the components of the respective embodiments.

REFERENCE SIGNS LIST 10, 20, 30, 40, 50, 60, 70, 80 sensor device
11, 21, 31, 41, 51, 61, 71, 81 control circuit
14, 24, 34, 44, 54, 64, 74, 84 LSI internal circuit (detection circuit)
15, 45, 55, 75 gate control circuit
L11, L21, L31, L41, L51, L61, L71, L81 power line
L12, L22, L32, L42, L52, L62, L72, L82 signal line
N12, N22, N32, N52, N62, N72, N82 second NMOS transistor
P11, P21, P31, P41, P51, P61, P71, P81 first PMOS transistor (first transistor)
P12, P22, P32, P42, P52, P72, P82 second PMOS transistor (second transistor)
P13, P23, P33, P43, P63, P73, P83 third PMOS transistor
P24, P64 fourth PMOS transistor
P85 fifth PMOS transistor
R11, R21, R31, R41, R51, R61, R71 load
R42, R52, R62, R72 resistor

The invention claimed is:

1. A control circuit which receives a power supply voltage from a power line and outputs an output signal to a signal line, comprising:
   a load which is provided between the power line and the signal line;

a first transistor which is provided between the load and the signal line or between the power line and the load;

a second transistor which is provided between a well of the first transistor and the power line; and a gate control circuit which connects a gate terminal of the first transistor and a gate terminal of the second transistor to the signal line and turns off the first transistor and the second transistor, at the time of disconnection of a power supply, wherein the first transistor is a first P-channel metal oxide semiconductor (PMOS) transistor, the second transistor is a second PMOS transistor, the gate control circuit includes:

a first element which is provided between a connection point between a gate terminal of the first PMOS transistor and a gate terminal of the second PMOS transistor and a ground; and a second element which is provided between the connection point between the gate terminal of the first PMOS transistor and the gate terminal of the second PMOS transistor and the signal line, and the gate control circuit connects the gate terminal of the first PMOS transistor and the gate terminal of the second PMOS transistor to the ground via the first element at the time of a normal operation and connects the gate terminal of the first PMOS transistor and the gate terminal of the second PMOS transistor to the signal line via the second element at the time of the disconnection of the power supply.

2. The control circuit according to claim 1, wherein the gate control circuit turns on the first transistor by connecting the gate terminal of the first transistor and the gate terminal of the second transistor to a ground and making a well potential of the first transistor become a power supply potential via the second transistor, at the time of a normal operation.

3. The control circuit according to claim 1, wherein the first element is an N-channel metal oxide semiconductor (NMOS) transistor and the second element is a third PMOS transistor, a gate terminal of the NMOS transistor is connected to the power line, and a gate terminal of the third PMOS transistor is connected to the power line.

4. The control circuit according to claim 3, wherein one input/output terminal of the second PMOS transistor is connected to the power line, and the other input/output terminal of the second PMOS transistor is connected to a well of the first PMOS transistor, a well of the second PMOS transistor, and a well of the third PMOS transistor.

5. The control circuit according to claim 4, further comprising a fourth PMOS transistor which is provided between a connection point between the well of the first PMOS transistor and the well of the second PMOS transistor and the signal line, wherein a gate terminal of the fourth PMOS transistor is connected to the power line.

6. The control circuit according to claim 5, wherein one input/output terminal of the fourth PMOS transistor is connected to the well of the first PMOS transistor, the well of the second PMOS transistor, the well of the third PMOS transistor, and a well of the fourth PMOS transistor, and the other input/output terminal of the fourth PMOS transistor is connected to the signal line.

7. The control circuit according to claim 6, wherein any one of the second PMOS transistor and the fourth PMOS transistor is replaced with a resistor.

8. The control circuit according to claim 1, wherein the first element is a resistor, the second element is a third PMOS transistor, and a gate terminal of the third PMOS transistor is connected to the power line.

9. The control circuit according to claim 1, wherein the first element is an NMOS transistor, the second element is a resistor, and a gate terminal of the NMOS transistor is connected to the power line.

10. The control circuit according to claim 1, wherein the load is composed of a resistor or a transistor.

11. A sensor device comprising:

the control circuit according to claim 1; and a detection circuit which outputs a control signal according to a physical quantity to the control circuit.

* * * * *